United States Patent [19]

Dubroeucq et al.

[11] 4,132,479

[45] Jan. 2, 1979

[54] PATTERN TRANSFER OPTICAL SYSTEM

[75] Inventors: Georges Dubroeucq; Michael Lacombat, both of Paris, France

[73] Assignee: Thomson-CSF, Paris, France

[21] Appl. No.: 858,402

[22] Filed: Dec. 7, 1977

[30] Foreign Application Priority Data

Dec. 10, 1976 [FR] France .................................. 76 37327

[51] Int. Cl.² .......................................... G03B 27/76
[52] U.S. Cl. .................................. 355/71; 350/162 R
[58] Field of Search ........................... 355/67, 71, 77; 350/162 R, 162 SF, 3.5, 160 R; 346/107 R

[56] References Cited

U.S. PATENT DOCUMENTS

| 3,407,294 | 10/1968 | Hill | 355/67 X |
| 3,988,066 | 10/1976 | Suzuki et al. | 355/71 X |

Primary Examiner—Richard A. Wintercorn
Attorney, Agent, or Firm—Cushman, Darby & Cushman

[57] ABSTRACT

The invention relates to optical systems intended for the transfer of patterns onto a photosensitive surface. The system according to the invention comprises a source of coherent radiation which is intended to illuminate the photosensitive surface for a predetermined duration and which is associated with transmission means introducing a wavefront modulation of the radiation intended to average during the exposure time, the interference fringes produced by the coherence of the radiation.

17 Claims, 4 Drawing Figures

PATTERN TRANSFER OPTICAL SYSTEM

This invention relates to optical devices intended for transferring patterns to a photosensitive surface, comprising a light source for exposing the photosensitive surface via an object of which the non-uniform transparency characterises the pattern to be transferred. More particularly, the invention relates to devices based on contact or proximity copying and also to devices where an image of the object is projected onto the photosensitive surface.

The invention is applicable in particular to the production of semiconductor components by a step and repeat process wherein one or more images of small dimensions from patterns produced on a much larger scale are reproduced on a support. The support may act as a mask intended for transfer without any change of scale by transfer machines onto a semiconductor substrate coated with a photosensitive resin. Transfer may also be effected without this intermediate mask by the technique of direct pattern projection.

In this latter case, the step and repeat process is carried out for each substrate whereas, in the first case, it is carried out to form the intermediate mask or masks which will be used for the global printing of the photoresistcoated substrates. Accordingly, if the direct step and repeat technique is to be viable in relation to the first technique, it is necessary to obtain very short exposure times.

Direct photorepetition is particularly interesting in cases where it is desired to form images of patterns of small dimensions (less than 4 μm) on the semiconductor — a result which is difficult to obtain with conventional transfer machines.

The light source used in the photorepeaters is an extended incoherent light source of the mercury vapour lamp type emitting a radiation whose wavefronts have no precise phase centre. This source is generally followed by a monochromator filter which is necessary for eliminating the chromatic aberration attributable to the lenses of the optical projection system. The monochromatism contributes towards the quality of the projected images and facilitates the production of the projection lens. However, the presence of this filter and the extent of the light source give rise to a very low energy utilisation level. The radiation is generally transmitted to the optical system by means of optical fibres so as to improve the homogeneity of the light beam.

Nevertheless, the luminous intensity available at the level of the surface to be exposed remains low by comparison with the luminous energy emitted by the source. If it is considered that, in order suitably to form an image on the photosensitive layer, the photosensitive layer has to receive a sufficiently large amount of exposure energy, it will be appreciated that, to reduce the exposure time, it is necessary considerably to increase the liminous power received by the photosensitive layer to be exposed.

The advantages afforded by the essential characteristics of laser over conventional sources lie primarily in a significant increase in the luminous power which can be utilised, providing for a considerable increase in the speed of execution of the pattern transfers and, above all, for an improvement in resolution at the level of the optical imaging means used. The elimination of the monochromator filter provides for simplicity. However, the use of a source of coherent radiation, such as a laser gives rise to parasitic interference figures caused by the coherence of the radiation.

In accordance with the present invention there is provided a pattern transfer optical system for forming onto a support coated with a layer of photosensitive material an image of a pattern carried by an object of non uniform transparency, said system comprising illumination means illuminating said object for supplying an exposure of predetermined duration; said illumination means comprising a source of coherent light and optical modulation means; said optical modulation means comprising a moving element imparting to the luminous radiation transmitted from said source to said object wavefront fluctuations of short duration as compared to said duration, thereby averaging unwanted fringe patterns created in said image by said coherent light.

For a better understanding of the invention, and to show how the same may be carried into effect, reference will be made to the following figures among which:

Figure 1:
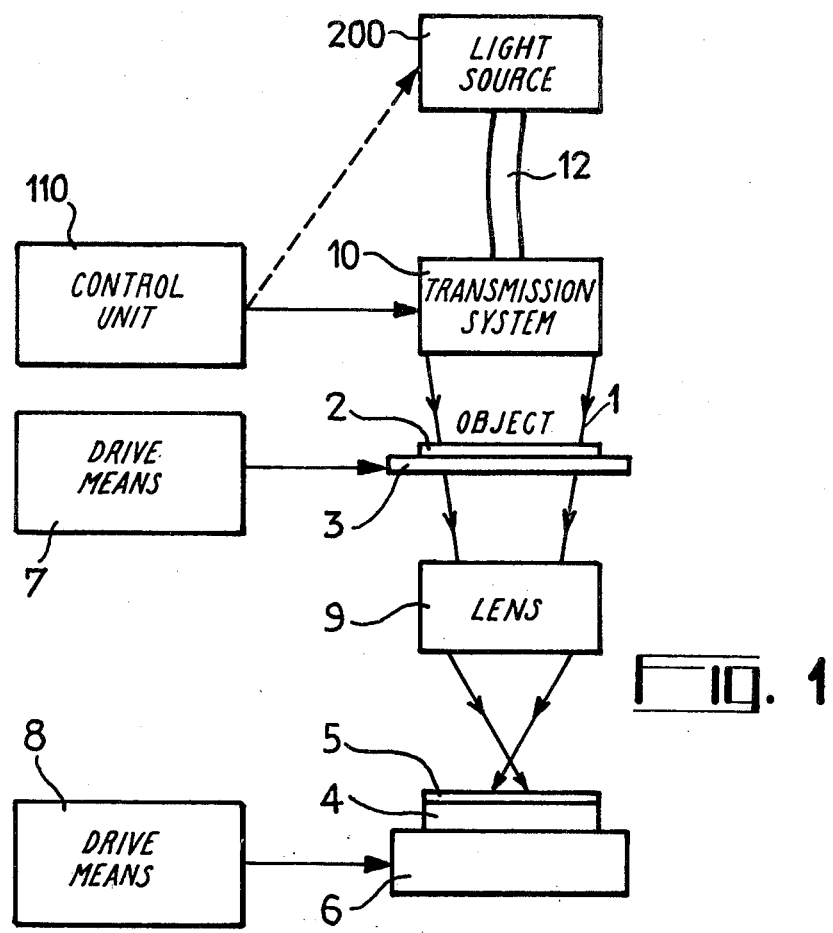
FIG. 1 shows the general layout of a conventional photorepeater.

FIG. 1 shows the general layout of a conventional photorepeater provided with a lens. It comprises an object 2 carrying the pattern to be reproduced and arranged on a plate 3 and a support 4 coated with a photosensitive layer 5 arranged on a plate 6. The precise positioning of the plates 3 and 6 is obtained by drive means 7 and 8. In the majority of photorepeaters, the object 2 is a photographic plate carrying a drawing which forms the pattern.

Accordingly, the support is a mask formed by a transparent plate coated with a photographic emulsion or with a layer of photoresist covering a thin, opaque deposit intended for engraving (chromium, iron oxide). Photorepetition consists in reproducing the pattern on the mask to a fixed scale a large number of times, for example according to an arrangement of lines and columns. This mask is subsequently used for the simultaneous transfer of the patterns onto semiconductor substrates by means of transfer machines separate from the photorepeater. There are also so-called direct photorepeaters in which the photorepetition process is carried out directly on the semiconductor substrate. Accordingly, the only difference between these two types of photorepeaters lies in the support, although this involves different specifications. However, the structure remains the same. It is obvious that the substrates may be formed by materials of the type used for the production of magnetic, electrical, optical or acoustic microcircuits.

Between the object 2 and the support 4, there is a lens 9 which forms the image of the object 2 on the support with a predetermined magnification factor, generally of from 1/5 to 1/20. Whilst retaining the parallelism and the optical conjugation of the object and the surface of the support to be exposed, the drive means 7 and 8 provide for the rectilinear and/or rotational movements required by the arrangement of the patterns which it is desired to obtain on the layer 5.

The object is illuminated by a light beam 1 through an optical transmissive system 10 which, if necessary, may act as a shutter. The luminous energy of the beam 1, emanates from a source 200 of non-coherent light.

Transmission means 12 provide for the transmission of this energy to the optical system 10. The means 12 comprise for example a set of mirrors or a connection by a single optical fibre or by a bundle of optical fibres. The exposure time is determined by the amount of energy required for printing the pattern on the support and depends upon the intensity with which the support is illuminated. The exposure time is controlled by a control device 110 which can act either on the source or on the optical system 10.

The lens 9 and the constituent elements of the optical system 10 are corrected to transmit without any troublesome aberration a light beam of which the spectrum occupies a wavelength range of the order of 20 nm. The light beam 1 must be quasi-monochromatic, which implies the use of a filter liable to introducing aberrations, being critical to use and securing an efficiency much smaller than 1. Besides conventional sources, there are coherent sources by which it is possible on the one hand to obtain better images and, on the other hand, to utilise all the luminous power. One such coherent source may be a laser selected to obtain the best sensitivity of impression, allowing for the sensitivity curve of the resin in dependence upon the wavelenght, and compatible with the optical elements used. However, unless precautions are taken, this promotes the appearance of troublesome stationary interference figures which have to be eliminated.

The use of a coherent source avoids the need to use a filter and, hence, the disadvantages which this involves. On the other hand, a laser can emit a parallel beam with minimal divergence of less than one milliradian. All this energy collected by a lens can therefore be focussed with precision. The exposure times may therefore be greatly reduced. In one typical embodiment, the use of a mercury vapour lamp leads to an exposure time of around 3 seconds whereas the use of a laser leads to an exposure time of the order of 50 ms.

Figure 2:
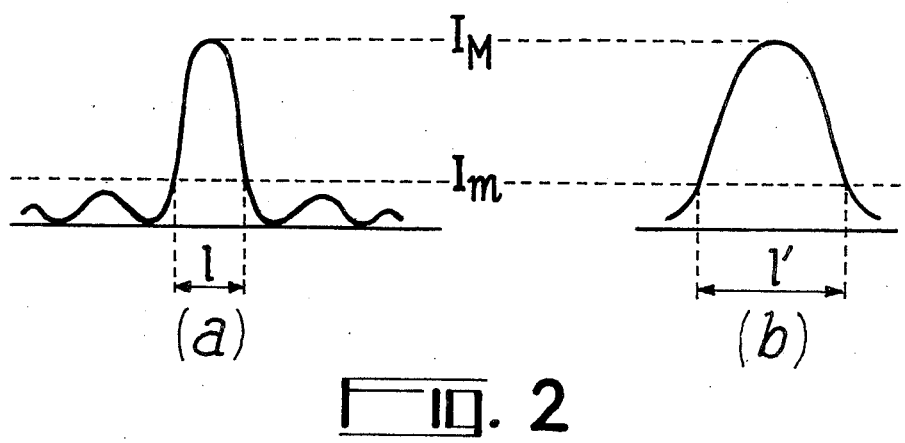
FIG. 2 shows the appearance of the image of a point obtained by coherent illumination and by non-coherent illumination.

One consequence of the spatial coherence of the radiation may be deduced from FIG. 2 which shows the image of a point obtained through a lens in two cases: in case (a) the illuminating beam is coherent; in case (b) the beam is incoherent.

It is assumed that the intensity of exposure is comprised within two limits $I_m$ and $I_M$ in the two cases. It can be seen from this figure that the diameter of the central spot of the diffraction pattern is much smaller with coherent radiation (1) than with incoherent radiation (1'). The oscillations situated on either side of the central spot in the case of the coherent radiation are negligible on condition that their level is below the threshold $I_m$, below which the resin is not printed for a given exposure time. From this, it follows that the resolution is considerably improved by the use of a laser as the light source.

Figure 3:
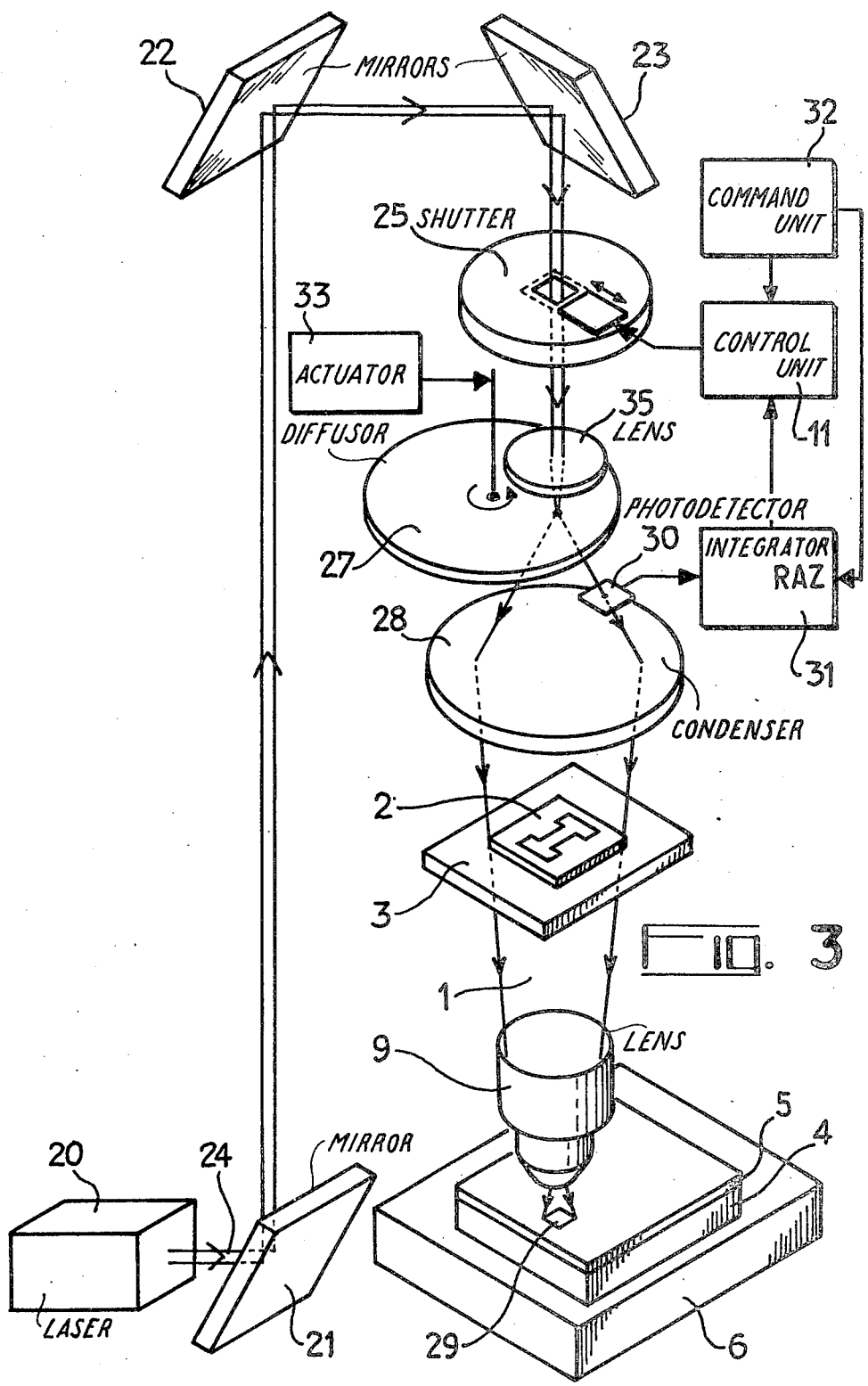
FIG. 3 shows one embodiment of the photorepeater according to the invention.

FIG. 3 shows one embodiment of a direct photorepeater according to the invention. The same reference numerals as in FIG. 1 have been used for the elements common to the two Figures. A laser source 20 continuously delivers a beam 24 having minimal divergence. For the convenience of the arrangement, the beam is transmitted by an assembly of mirrors 21, 22, 23 to a shutter 25 followed by a convergent lens 35, an optical modulation means 27 and a light condenser 28. The transfer lens 9 is mainly formed by an objective lens appropriate to the required scale which projects the light onto the desired zone 29 of a semiconductor substrate 4, for example silicon, coated with a layer 5 of photosensitive resin.

The role of the shutter is to enable the object 2 to be illuminated with a predetermined amount of luminous energy. The shutter closes when the exposure energy has reached the value for which an image is produced on the resin. The following mode of operation is described by way of example: a photodetector 30 is arranged in the path of the light beam to collect a constant fraction of the luminous intensity impinging on the object. The exit of the photodetector is connected to an integrator 31 which delivers an electrical signal increasing with the quantity of luminous energy from the opening of the shutter. The integrated electrical signal is applied to a control device 11 for the shutter 25. The control device contains a threshold comparator to which the integrated electrical signal is applied along with the value of the threshold issuing from a command unit 32. The control device 11 causes the shutter to close when the release threshold is reached. In addition, the unit 32 delivers a signal by which the integrator is reset to zero between two successive exposures.

By virtue of the mode of control, it is possible to obtain constant exposure energy amounts with precision because it allows for possible fluctuations in the intensity of the beam 1 for determining the duration of exposure.

One variant of the device consists in using a pulsed laser controlled by the device 11 which eliminates the need for the shutter. One advantage of a pulsed laser is that it enables a high peak power, generally higher than the power supplied by a continuous laser, to be delivered for a very short period.

The purpose of the optical modulation means 27 is to correct any defect which appears with coherent light on the images. Experience has shown that parasitic interference fringes occur. This phenomenon results from the fact that in coherent light stationary interference fringes are produced.

The interference fringes adversely affect the quality of the images obtained on the support. In order to overcome them, a phase modulation is artificially created in the beam to produce wavefront fluctuations of short duration resulting in a displacement of the interference fringes about a mean position so as to obtain several such displacements during the exposure time. The integration by the photosensitive layer thus enables the interference fringes to be smeared and eliminated by clipping without adversely affecting the quality of the images since the lens has not undergone any movement. The optical modulation means 27 produces this averaging modulation. It comprises a moving element in the form of a scattering disc to which a rapid rotation movement is imparted by means of a motor 33. The speed of rotation should be sufficient for the elimination of the interference figures.

The interference fringes may also be averaged and smeared by other means: by using a vibrating element or any transparent phase object which vibrates or rotates fairly rapidly, a plate of ordinary glass, a lens . . .

In cases where a scattering element is used, it simultaneously acts as a light expander which co-operates with the lens 35 and the condenser 28, for example a convergent lens, to deliver the expanded beam 1 which illuminates the object 2. In cases where a non-scattering element is used, the beam is expanded by the two lenses 35 and 28.

In one typical embodiment, a krypton gas laser was used, continuously delivering a parallel beam with a diameter of 1.6 mm and with a power P of 1.5 watts at a wavelength $\lambda_o$ of 410 ± 5 nm. The exposure time is 50 ms for 0.6 µm of positive resin in an 8 mm diameter field. The magnification of the lens is equal to 1/10.

The invention is not limited to direct photorepeaters operating by projection. It also relates to any image photoreproducer operating by projection, proximity or contact copying. In these two latter cases, the lens is omitted. The technique of reproduction by contact consists in keeping the object and the support perfectly parallel at a distance of a few microns.

Figure 4:
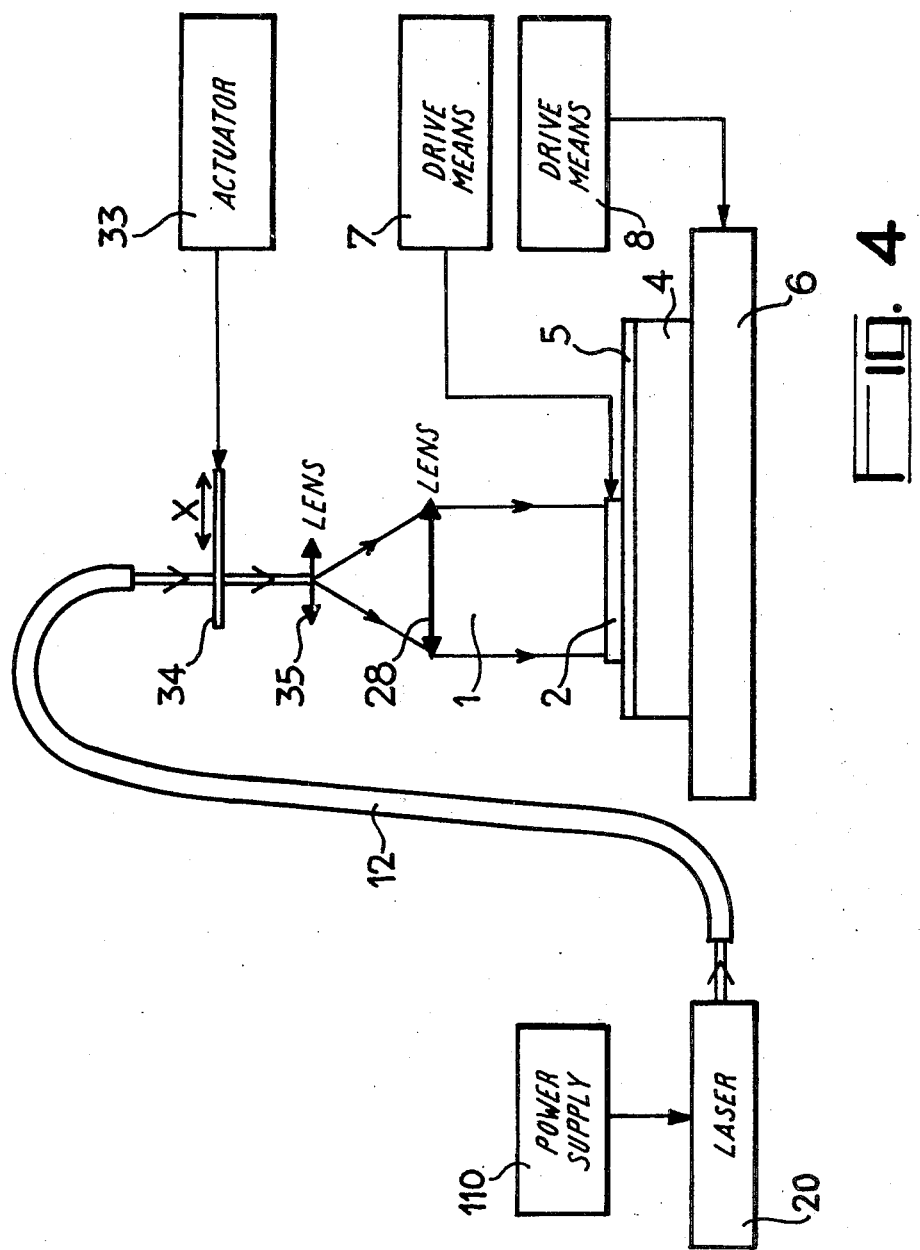
FIG. 4 shows a variant of the invention.

FIG. 4 diagrammatically illustrates a contact transfer machine using a pulsed laser 20 controlled by the device 110 according to the mode of operation described above. The light is transmitted by an optical fibre 12. The interference figures are averaged by a plate of glass 34 vibrating by means of a motor 33, as indicated by the arrow X. Two convergent lenses 35 and 28 produce an expanded, parallel beam 1. The pattern of the object 2 is reproduced on the support 4 coated with a photosensitive layer 5 with a scale 1. The object and the support are kept in contact by drive means 7 and 8, for example in the form of a servomotor.

The invention is by no means limited to the embodiments described above. The arrangement of the various elements may be varied without exceeding the scope of the invention.

What we claim is:

1. A pattern transfer optical system for forming onto a support coated with a layer of photosensitive material an image of a pattern carried by an object of non uniform transparency, said system comprising illumination means illuminating said object for supplying an exposure of predetermined duration; said illumination means comprising a source of coherent light and optical modulation means; said optical modulation means comprising a moving element imparting to the luminous radiation transmitted from said source to said object wavefront fluctuations of short duration as compared to said duration, thereby averaging unwanted fringe patterns created in said layer by said coherent light.

2. A system as claimed in claim 1, wherein said moving element is planar; a movement relative to the illuminating beam being imparted to said element in its plane.

3. A system as claimed in claim 2, wherein said moving element has a centre of rotation and is traversed by said beam outside said centre, said fluctuations being caused by the rotation of said moving element about said centre.

4. A system as claimed in claim 2, wherein the movement of said element is created by the vibration of said element in its plane.

5. A system as claimed in claim 2, wherein said moving element is a scattering element.

6. A system as claimed in claim 2, wherein said moving element is a phase-modulating transparent element.

7. A system as claimed in claim 1, wherein said source is a laser.

8. A system as claimed in claim 1, wherein said predetermined duration is controlled by a device which enables a predetermined quantity of exposure energy to be collected by said support.

9. A system as claimed in claim 8, wherein said device comprises a photodetecting probe collecting a fraction of the radiation transmitted to said object.

10. A system as claimed in claim 8, wherein said device acts on a shutter disposed in the path of said luminous radiation between said source and said object.

11. A system as claimed in claim 7, wherein said laser is a pulsed laser controlled by a device which enables a predetermined quantity of exposure energy to be collected by said support.

12. A system as claimed in claim 1, wherein a lens of predetermined magnification is disposed between said object and said support for imaging said pattern.

13. A system as claimed in claim 12, further comprising step and repeat means for moving said support so as to form said image repetitively according to a predetermined arrangement.

14. A system as claimed in claim 1, further comprising means for bringing said object into contact with said support during said predetermined duration.

15. A system as claimed in claim 1, further comprising means for keeping said object in the immediate proximity of said support during said predetermined duration.

16. A system as claimed in claim 1, wherein said support is a semiconductor substrate coated with a photosensitive resin.

17. A system as claimed in claim 1, wherein said support is a photographic plate.

* * * * *